(12) United States Patent
Kim et al.

(10) Patent No.: US 9,386,726 B2
(45) Date of Patent: Jul. 5, 2016

(54) CONTROLLER

(71) Applicant: SAMSUNG ELECTRONICS CO., LTD., Suwon-si, Gyeonggi-do (KR)

(72) Inventors: Nam Su Kim, Seoul (KR); Jong Jin Park, Suwon-si (KR); Young Kwan Kim, Anyang-si (KR); Jong Jun Seo, Suwon-si (KR); Bu Mun Jung, Suwon-si (KR); Woong Hwang, Suwon-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 140 days.

(21) Appl. No.: 14/268,240

(22) Filed: May 2, 2014

(65) Prior Publication Data

US 2014/0328025 A1     Nov. 6, 2014

(30) Foreign Application Priority Data

May 6, 2013    (KR) .................... 10-2013-0050736

(51) Int. Cl.
*H05K 7/20*     (2006.01)
*H01L 23/473*     (2006.01)

(52) U.S. Cl.
CPC .................... *H05K 7/20436* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ........ 361/676–678, 679.46–679.54, 361/688–723; 156/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| | | | | |
|---|---|---|---|---|
| 2003/0156385 | A1* | 8/2003 | Askeland | G06F 1/182 361/679.51 |
| 2005/0024823 | A1* | 2/2005 | Jo | G06F 1/20 361/679.48 |
| 2005/0024838 | A1* | 2/2005 | Maxwell | H01L 23/5385 361/782 |
| 2006/0034051 | A1* | 2/2006 | Wang | H05K 7/20209 361/696 |
| 2006/0067054 | A1* | 3/2006 | Wang | H01L 23/3672 361/704 |

(Continued)

FOREIGN PATENT DOCUMENTS

KR    10-2011-0020314    3/2011

OTHER PUBLICATIONS

European Search Report issued Feb. 10, 2015 in corresponding European Patent Application No. 14166455.7.

*Primary Examiner* — Anthony Haughton
*Assistant Examiner* — Razmeen Gafur
(74) *Attorney, Agent, or Firm* — Staas & Halsey LLP

(57) ABSTRACT

A controller including a case provided with at least one opened surface, a cover opening and closing the at least one opened surface, and a circuit board provided within the case and provided with a heating unit. The cover includes a cover body and a heat radiation unit in which at least a portion of the inner surface of the cover body is concave toward the circuit board so as to be closely adhered to the heating unit for the purpose of heat radiation. Thereby, heat within the controller may be effectively radiated and the lifespan of electrical devices may be extended.

17 Claims, 9 Drawing Sheets

(56) References Cited

U.S. PATENT DOCUMENTS

| | | | | |
|---|---|---|---|---|
| 2006/0176672 A1* | 8/2006 | Kamemoto | H05K 7/2049 | 361/714 |
| 2006/0187643 A1* | 8/2006 | Tsurufusa | H05K 7/2049 | 361/704 |
| 2006/0187645 A1* | 8/2006 | Numata | H05K 7/2049 | 361/704 |
| 2006/0232942 A1* | 10/2006 | Nakatsu | B60L 11/08 | 361/710 |
| 2007/0165376 A1* | 7/2007 | Bones | H01L 25/162 | 361/688 |
| 2007/0230132 A1* | 10/2007 | Lee | H05K 7/20963 | 361/707 |
| 2007/0268669 A1* | 11/2007 | Attlesey | G06F 1/185 | 361/699 |
| 2007/0279871 A1* | 12/2007 | Ishida | H05K 1/0204 | 361/704 |
| 2007/0285891 A1* | 12/2007 | Noble | H05K 7/20963 | 361/699 |
| 2007/0291450 A1* | 12/2007 | Watanabe | H05K 7/20518 | 361/688 |
| 2008/0239669 A1* | 10/2008 | Wayman | H01L 23/367 | 361/697 |
| 2009/0154111 A1* | 6/2009 | Lynch | H01L 25/0657 | 361/719 |
| 2009/0262503 A1* | 10/2009 | Kaneko | H05K 7/20854 | 361/706 |
| 2010/0014252 A1* | 1/2010 | Hamatani | H01G 2/106 | 361/707 |
| 2010/0128432 A1* | 5/2010 | Miller | H05K 7/20836 | 361/679.54 |
| 2011/0075366 A1* | 3/2011 | Tomioka | H05K 7/20336 | 361/697 |
| 2011/0228498 A1 | 9/2011 | Kawai et al. | | |
| 2011/0286185 A1* | 11/2011 | Abe | H05K 7/209 | 361/710 |
| 2011/0292624 A1 | 12/2011 | Tanaka et al. | | |
| 2012/0106070 A1* | 5/2012 | Landon | G06F 1/183 | 361/679.47 |
| 2012/0300393 A1* | 11/2012 | Kawano | G06F 1/203 | 361/679.48 |
| 2012/0327590 A1* | 12/2012 | Heydari | G06F 1/20 | 361/679.47 |

* cited by examiner

CONTROLLER

CROSS-REFERENCE TO RELATED APPLICATIONS

This application claims the benefit of Korean Patent Application No. 10-2013-0050736, filed on May 6, 2013 in the Korean Intellectual Property Office, the disclosure of which is incorporated herein by reference.

BACKGROUND

1. Field

Embodiments of the present disclosure relate to a controller having an improved heat radiation structure.

2. Description of the Related Art

In general, a controller controlling an electronic product, such as a refrigerator or an air conditioner, includes various electric devices and electronic devices. Electric devices and electronic devices generally discharge a large amount of heat and, if heat radiation is not properly carried out, the electric devices and electronic devices malfunction and are damaged.

Particularly, in such an electronic product, such as a refrigerator or an air conditioner, in order to continuously control the product, operation loads of electric devices and electronic devices are generated for a long time and thus, a heat radiation structure for the controller is required.

SUMMARY

Therefore, it is an aspect of the present disclosure to provide a controller which may increase heat radiation efficiency and be lowered in temperature in a normal state.

Additional aspects of the disclosure will be set forth in part in the description which follows and, in part, will be apparent from the description, or may be learned by practice of the disclosure.

In accordance with one aspect of the present disclosure, a controller includes a case provided with at least one opened surface, a cover opening and closing the at least one opened surface, and a circuit board provided within the case and provided with a heating unit, wherein the cover includes a cover body and a heat radiation unit in which at least a portion of the inner surface of the cover body is convex inwardly toward the circuit board, so as to be closely adhered to the heating unit for the purpose of heat radiation.

The rear surface of the heat radiation unit may be concave, as compared to the outer surface of the cover body adjacent thereto.

The convex degree of the inner surface of the cover body inwardly toward the circuit board and the concave degree of the rear surface of the heat radiation unit may be the same.

The heat radiation unit may include a heat radiation plate closely adhered to the upper surface of the heating unit and a support part bent from the outer circumferential portion of the heat radiation plate and connected to the cover body.

The thickness of the cover body may be smaller than the thickness of the heat radiation unit.

The thickness of the cover body may be smaller than the thickness of the heat radiation plate.

The thickness of the heat radiation plate and the thickness of the support part may be the same.

The heat radiation plate may be provided so as to be closely adhered to the whole upper surface of the heating unit.

If one end of the support part provided at the side of the heat radiation plate has a first lengthwise width and a first breadthwise width and the other end of the support part provided at the side of the cover body has a second lengthwise width and a second breadthwise width, the first lengthwise width and the first breadthwise width may be smaller than the second lengthwise width and the second breadthwise width.

The controller may further include a heat radiation sheet provided on one surface of the heat radiation plate contacting the heating unit to increase a heat radiation area.

The upper ends of the heat radiation plate and the heating unit may be formed in a rectangular shape.

The heat radiation unit may further include at least one heat radiation fin traversing a heat radiation space, formed by the heat radiation plate, the support part and the outer surface of the cover body, and supported by the support part and the heat radiation plate.

The thickness of a portion of the at least one heat radiation fin at the side of the outer surface of the cover body may be smaller than the thickness of a portion of the at least one heat radiation fin at the side of the heat radiation plate.

The heating unit may include a heating device disposed on the circuit board and a device cover surrounding the heating device, the inner and outer surfaces of the device cover contacting the heating device and the heat radiation unit.

The heating device may be an intelligent power module (IPM).

The cover may be formed of aluminum.

In accordance with another aspect of the present disclosure, a controller includes a case provided with an opened surface, a circuit board provided within the case and provided with a heating unit, and a cover including a cover body and a heat radiation unit protruding and extending inwardly from the cover body toward the circuit board, and opening and closing the opened surface, wherein the heat radiation unit includes a heat radiation plate closely adhered to the upper surface of the heating unit and a support part bent from the outer circumferential portion of the heat radiation plate, extending from the heat radiation plate, and connected to the cover body.

The thickness of the heat radiation plate and the thickness of the support part may be the same.

The controller may further include a heat radiation space provided with the lower surface surrounded by the heat radiation plate, the upper surface surrounded by the outer surface of the cover body, and the side surface surrounded by the support part, and the area of a region of the heat radiation space at the side of the outer surface of the cover body may be greater than the area of a region of the heat radiation space at the side of the heat radiation plate.

The controller may further include a heat radiation sheet provided on one surface of the heat radiation plate contacting the heating unit to increase a heat radiation area.

The heating unit may include a heating device disposed on the circuit board and a device cover surrounding the heating device, the inner and outer surfaces of the device cover contacting the heating device and the heat radiation unit.

In accordance with a further aspect of the present disclosure, a controller includes a case provided with at least one opened surface, a cover opening and closing the at least one opened surface, a circuit board provided within the case and provided with a heating unit, and a heat radiation unit formed by bending the inner and outer surfaces of at least a portion of the cover body in the direction of the heat radiation unit, wherein the heat radiation unit includes a concave part in which the outer surface of the heat radiation unit is concave, as compared to the outer surface of the cover and a convex part in which the inner surface of the heat radiation unit corresponding to the outer surface of the heat radiation unit is convex, as compared to the inner surface of the cover, the convex part contacting the heating unit.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
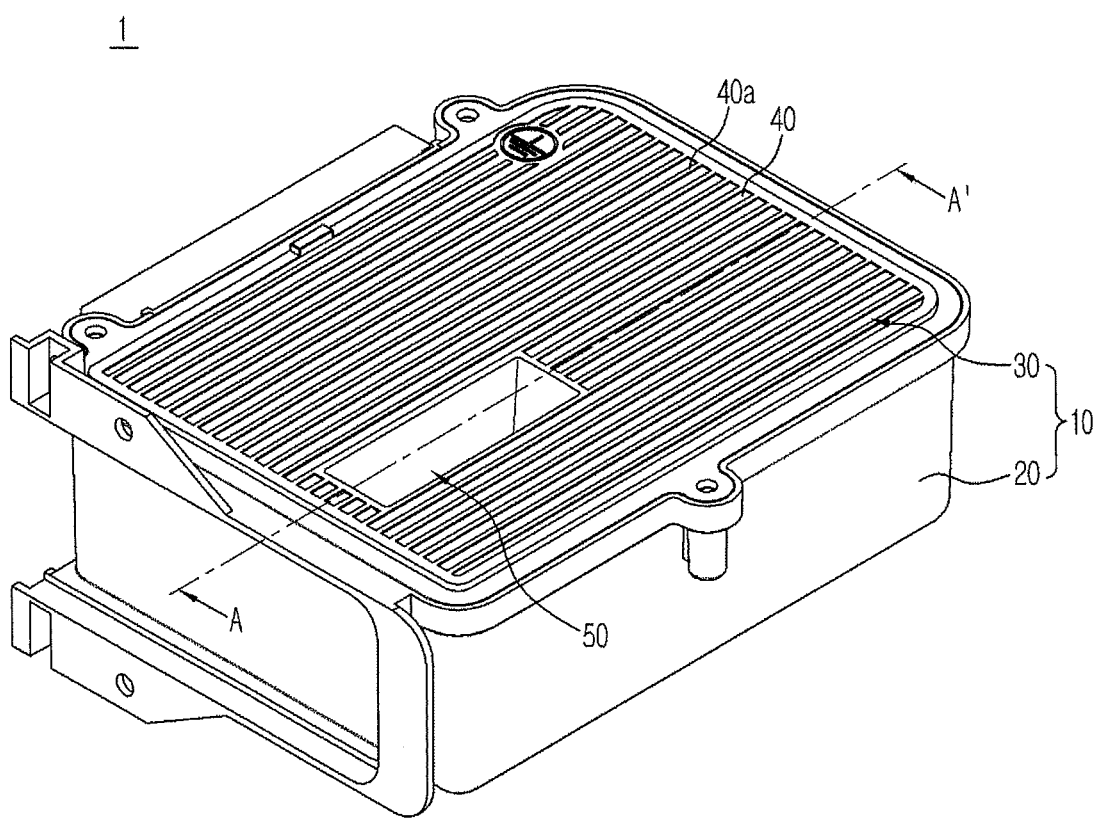
FIG. 1 is a perspective view of a controller in accordance with one embodiment of the present disclosure.

Reference will now be made in detail to the embodiments of the present disclosure, examples of which are illustrated in the accompanying drawings, wherein like reference numerals refer to like elements throughout.

Figure 2:
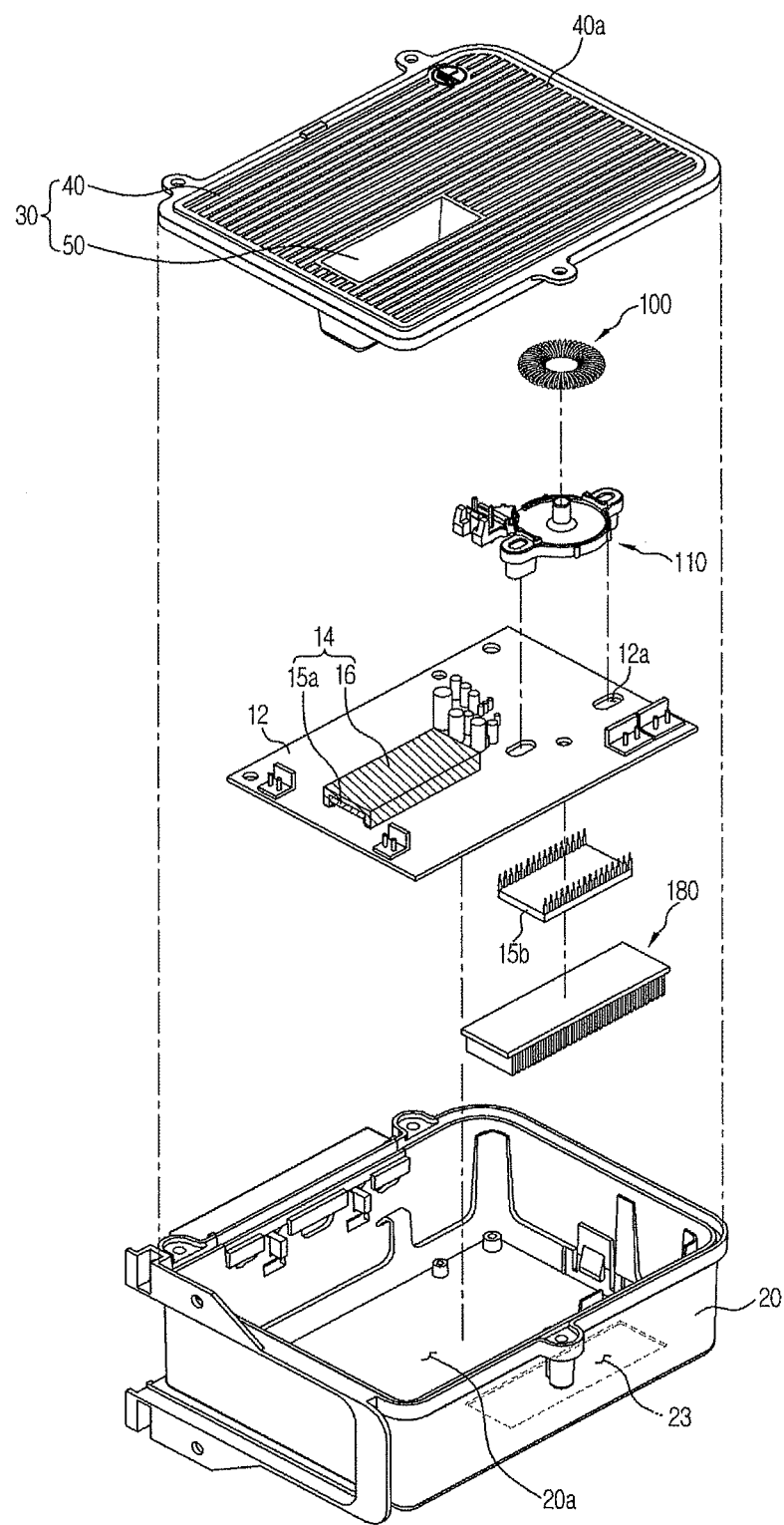
FIG. 2 is an exploded perspective view of the controller in accordance with the embodiment of the present disclosure.
Figure 3:
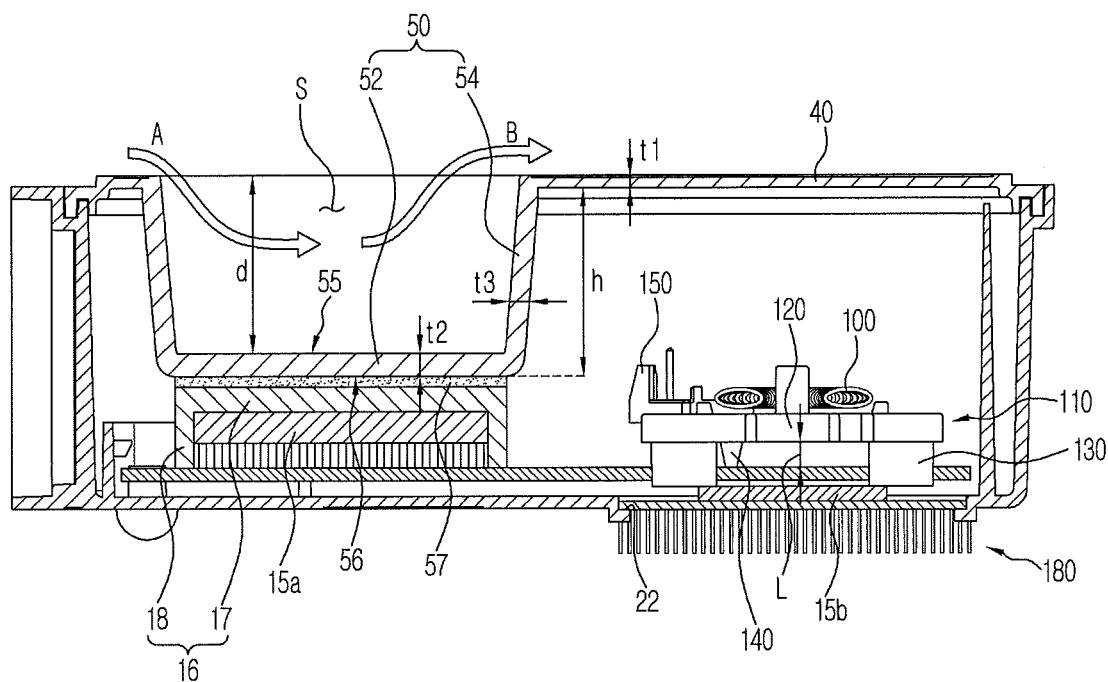
FIG. 3 is a cross-sectional view of FIG. 1 taken along line A-A'.
Figure 4:
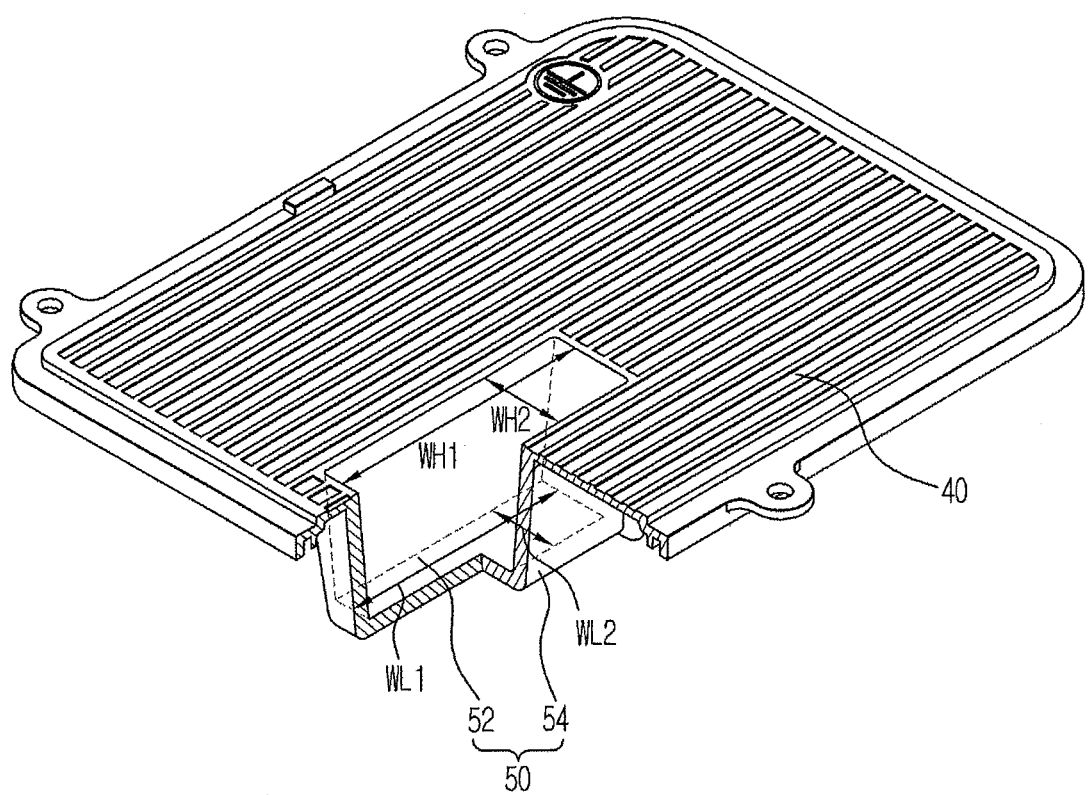
FIG. 4 is a perspective cross-sectional view of a cover in accordance with one embodiment of the present disclosure.

FIG. 1 is a perspective view of a controller in accordance with one embodiment of the present disclosure, FIG. 2 is an exploded perspective view of the controller in accordance with the embodiment of the present disclosure, FIG. 3 is a cross-sectional view of FIG. 1 taken along line A-A', and FIG. 4 is a perspective cross-sectional view of a cover in accordance with one embodiment of the present disclosure.

A controller 1 in accordance with one embodiment of the present disclosure may include a casing module 10 and a control module.

The casing module 10 includes a case 20 and a cover 30, and the control module includes a circuit board 12.

The case 20 may be provided with at least one opened surface 20a, and the cover 30 may cover the at least one opened surface 20a. In this embodiment, the case 20 is provided with one opened surface 20a, and the cover 30 covers the opened surface 20a of the case 20. The circuit board 12 is fixedly disposed within the case 20.

The cover 30 provided to cover the opened surface 20a of the case 20 may be formed of a metal sheet material having high thermal conductivity, such as aluminum.

The circuit board 12 receives control power and driving power supplied by an input/output connector (not shown) and serves to process an internal signal. A plurality of electrical devices may be mounted on the upper and lower surfaces of the circuit board 12. The plurality of electrical devices may include a heating unit 14 including a heating device 15a which will be described below.

The heating unit 14 may include the heating device 15a and a device cover 16.

The heating device 15a is mounted on the circuit board 12 and causes heat generation due to current flow. The heating device 15a may include many kinds of electrical devices, such as an intelligent power module (IPM). The device cover 16 may be provided to cover the upper and side surfaces of the heating device 15a, increase a heat generation area of the heating device 15a, improve heat generation efficiency, and facilitate close adhesion to a heat radiation plate 52 which will be described later.

The device cover 16 may serve to absorb heat generated from the heating device 15a, contact the heat radiation unit 50 to transfer heat, and be formed of a metal sheet material having high thermal conductivity. The device cover 16 may be formed of aluminum.

The device cover 16 may include a heat radiation assisting plate 17 and supporters 18.

The heat radiation assisting plate 17 may contact the upper surface of the heating device 15a and serve to absorb and transfer heat generated from the heating device 15a to the heat radiation unit 50. Further, by adjusting the thickness of the heat radiation assisting plate 17 in design, the upper and lower surfaces of the heat radiation assisting plate 17 may contact the lower surface of the heat radiation unit 15 and the upper surface of a thermoelectric device.

The supporters 18 are provided at both ends of the heat radiation assisting plate 17 and may cause the heat radiation assisting plate 17 to be supported by the circuit board 12 without application of pressure to the heating device 15a by the heat radiation assisting plate 17 in consideration of the thickness of the heating device 15a.

The cover 30 may include a cover body 40 closing the opened surface 20a of the case 20 and the heat radiation unit 50 extended from the cover body 40.

The cover body 40 together with the heat radiation unit 50 may be provided to open and close the opened surface 20a and be combined with one side of the case 20 forming the opened surface 20a.

The outer surface of the cover body 40 may include prominences and depressions 40a to increase the surface area of the cover body 40 in consideration of heat radiation efficiency.

The heat radiation unit 50 absorbs heat generated from the heating unit 14 and then, the heating radiation unit 50 together with the cover body 40 may radiate the heat to the outside of the controller 1.

The heat radiation unit 50 is closely adhered to the heating unit 14 for the purpose of heat radiation, at least a portion of the inner surface of the cover body 40 may be convex inwardly toward the circuit board 12, and the rear surface of the heat radiation unit 50 may be concave, as compared to the outer surface of the cover body 40 adjacent thereto. Further, the convex degree of the inner surface of the cover body 40 inwardly toward the circuit board 12 and the concave degree of the rear surface of the heat radiation unit 50 may be substantially the same.

On a different angle, the heat radiation unit 50 may include a concave part 55 in which the outer surface of the heat radiation unit 50 is concave, as compared to the outer surface of the cover 30, and a convex part 56 in which the inner surface corresponding to the outer surface of the heat radiation unit 50 is convex, as compared to the inner surface of the cover 30. The convex part 56 may be closely adhered to the upper surface of the heating unit 14. The convex part 56 is formed to have a designated height h from the inner surface of the cover body 40. The concave part 55 is formed to have a designated depth d from the outer surface of the cover body 40.

The heat radiation unit 50 may include a heat radiation plate 52 and a support part 54.

The heat radiation plate 52 contacts the upper surface of the heating unit 14 and receives heat from the heating unit 14 and the shape and area of the heat radiation plate 52 may be substantially the same as those of the upper surface of the heating unit 14. In this embodiment of the present disclosure, the heating unit 14 is formed in a rectangular shape and thus, the heat radiation plate 52 is formed in a rectangular shape, but embodiments of the present disclosure are not limited thereto. One surface of the heat radiation plate 52 at the side of the heating unit 14 becomes the convex part 56 and the other surface of the heat radiation plate 52 becomes the concave part 55.

A heat radiation sheet 57 increasing a contact area between the heat radiation plate 52 and the heating unit 14 to increase a heat radiation area may be provided between the heat radiation plate 52 and the heating unit 14. The heat radiation sheet 57 may level the surfaces of the heat radiation plate 52 and the heating unit 14 and thus increase the heat radiation area.

The support part 54 serves to the heat radiation plate 52 and the cover body 40. That is, the cover body 40 and the heat radiation plate 52 may be separately provided and the support part 54 bent and extended from the outer circumferential portion of the heat radiation plate 52 may be connected to the cover body 40.

One end of the support part 54 at the side of the heat radiation plate 52 has a designated first lengthwise width WL1 and a designated first breadthwise width WL2, and the other end of the support part 54 at the side of the cover body 40 has a designated second lengthwise width WH1 and a designated second breadthwise width WH2. Here, the second lengthwise width WH1 and second breadthwise width WH2 of the end of the support part 54 at the side of the cover body 40 may be equal to or greater than the first lengthwise width WL1 and first breadthwise width WL2 of the end of the support part 54 at the heat radiation plate 52. If the widths WH1 and WH2 of the end of the support part 54 at the side of the cover body 40 are equal to or greater than the widths WL1 and WL2 of the end of the support part 54 at the heat radiation plate 52, air flowing in the heat radiation unit 50 may be circulated without stagnation and thus, heat radiation efficiency may be increased.

On a different angle, the heat radiation unit 50 protrudes inwardly from the cover body 40 and thus, a heat radiation space S may be formed by the heat radiation plate 52 and the support part 54. The heat radiation space S has a designated height corresponding to the depth d of the concave part 55, the upper region of the heat radiation space S has the designated second lengthwise width WH1 and second breadthwise width WH2, and the lower region of the heat radiation space S has the designated first lengthwise width WL1 and first breadthwise width WL2. The first lengthwise width WL1, first breadthwise width WL2, second lengthwise width WH1, and second breadthwise width WH2 will be described again later.

Air flowing above the cover body 40 may be introduced into the upper region of the heat radiation space S formed by the heat radiation unit 50, as shown in arrow A, and then pass through the lower region of the heat radiation space S and flow out of the upper region of the heat radiation space S to the outside, as shown in arrow B. Thereby, air flow efficiency may be increased and heat radiation efficiency may be increased.

The cover body 40, the heat radiation plate 52, and the support part 54 are formed to respectively have designated thicknesses t1, t2, and t3. The thickness t2 of the heat radiation plate 52 may be equal to or greater than the thickness t1 of the cover body 40.

Further, the thickness t3 of the support part 54 may be equal to or greater than the thickness t1 of the cover body 40, and be equal to or smaller than the thickness t2 of the heat radiation plate 52. That is, the thicknesses t1, t2, and t3 of the cover body 40, the heat radiation plate 52, and the support part 54 may satisfy t$1 \leq$t$3 \leq$t$2$. This allows heat absorbed from the heat radiation plate 52 to rapidly move to the cover body 40 via the support part 54 in consideration of thermal conductivities and thermal transfer coefficients. Further, since surface areas are increased in order of the heat radiation plate 52, the support part 54 and the cover body 40, heat reaching the cover body 40 may be radiated to the outside in a short time.

The heat radiation plate 52, the outer surface of the cover body 40, and the support part 54 may form the heat radiation space S. In more detail, the lower surface of the heat radiation space S may be surrounded by the heat radiation plate 52, the upper surface of the heat radiation space S may be surrounded by the outer surface of the cover body 40, and the side surface of the heat radiation space S may be surrounded by the support part 54.

The heat radiation space S may be formed such that the area of the upper surface of the heat radiation space S formed at the outer surface of the cover body 40 is greater than the area of the lower surface of the heat radiation space S formed at the heat radiation plate 52.

Figure 5:
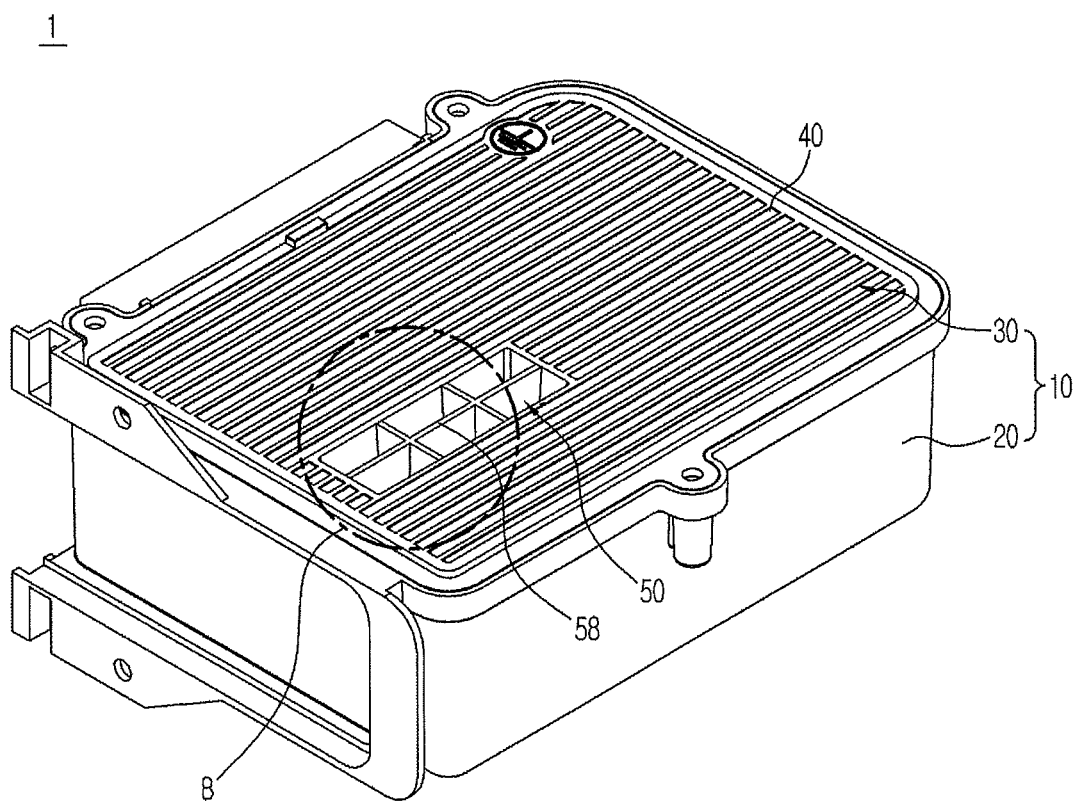
FIG. 5 is a perspective view of a controller in accordance with another embodiment of the present disclosure.
Figure 6:
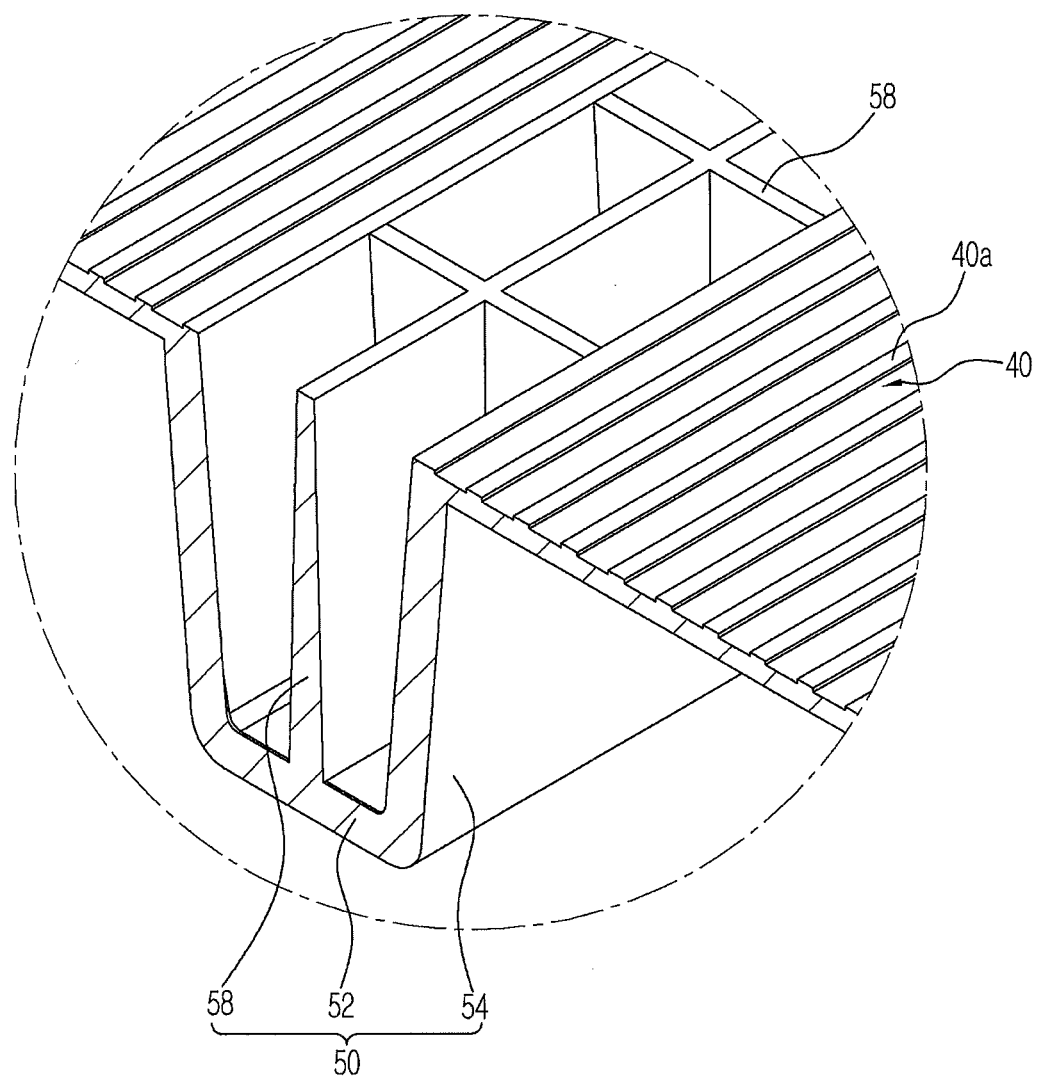
FIG. 6 is a perspective cross-sectional view of a region B of FIG. 5.

FIG. 5 is a perspective view of a controller in accordance with another embodiment of the present disclosure and FIG. 6 is a perspective cross-sectional view of a region B of FIG. 5. Some parts in this embodiment are substantially the same as those in the embodiment shown in FIGS. 1 to 4 and a detailed description thereof will thus be omitted because it is considered to be unnecessary.

A heat radiation unit 50 may include at least one heat radiation fin 58 provided in a heat radiation space S.

The at least one heat radiation fin 58 may be formed in a plate shape and traverse the heat radiation space S, and ends of the heat radiation fin 58 may be supported by a support part 54 and a heat radiation plate 52. The thickness of a portion of the heat radiation fin 58 at the side of the outer surface of the cover body 40 may be smaller than the thickness of a portion of the heat radiation fin 58 at the side of the heat radiation plate 52. At least one heat radiation fin 58 may be provided in the same direction, or a plurality of heat radiation fins 58 may be overlapped in a lattice shape.

Hereinafter, a heat radiation process of the controller 1 having the above-described configuration will be described.

Heat generated from the heating device 15*a* is firstly absorbed by the device cover 16 covering the heating device 15*a*.

The heat absorbed by the device cover 16 is transferred to the heat radiation plate 52 of the heat radiation unit 50, and the heat radiation plate 52 transfers heat to the support part 54 and the cover body 40 and thus radiates the heat through heat exchange with external air.

During such a process, external air may be introduced into the heat radiation space S, formed by the heat radiation plate 52, the support part 54 and the outer surface of the cover body 40, and then be discharged to the outside, thus increasing heat radiation effects.

Since the area of the lower region of the heat radiation space S at the side of the heat radiation plate 52 is smaller than the area of the upper region of the heat radiation space S at the side of the outer surface of the cover body 40, external air may be effectively introduced into and discharged out of the heat radiation space S.

Figure 7:
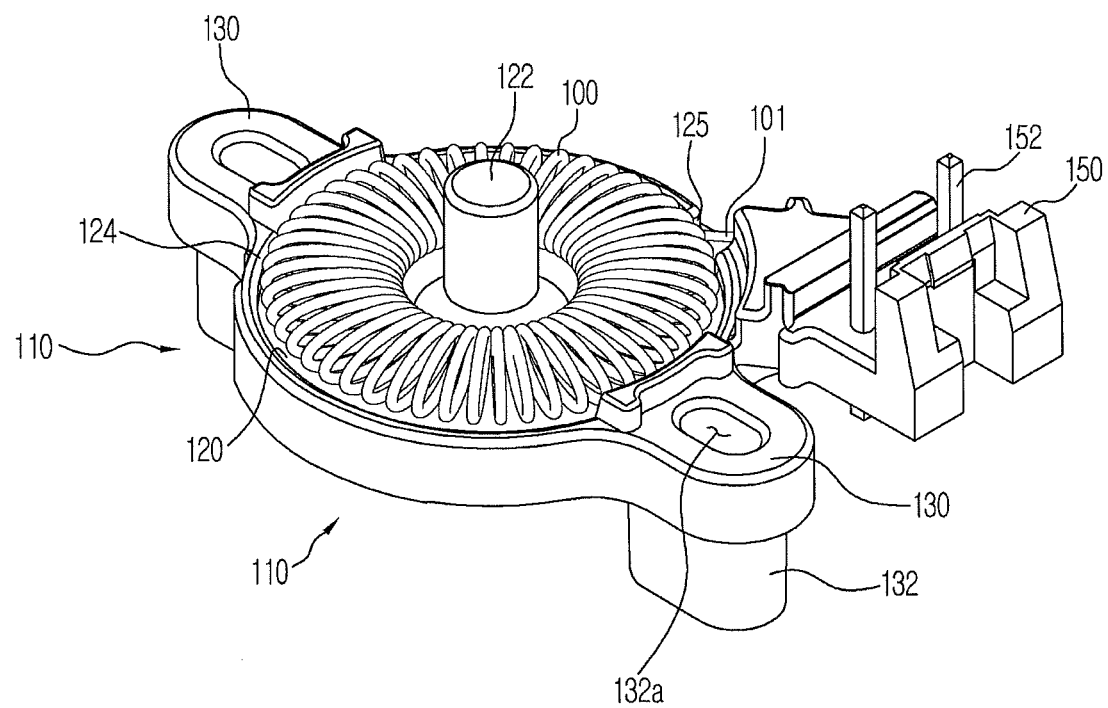
FIG. 7 is a perspective view illustrating a reactor and a reactor bracket in accordance with one embodiment of the present disclosure.
Figure 8:
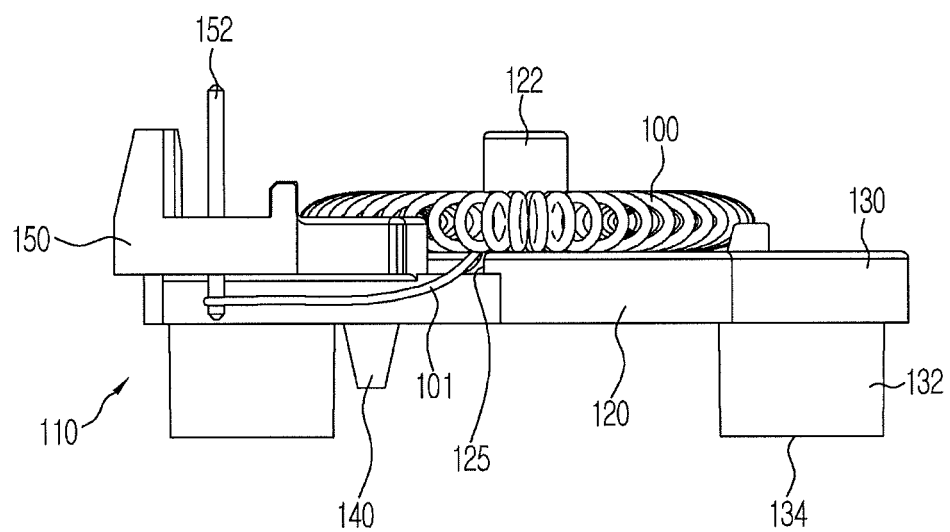
FIG. 8 is a front view illustrating the reactor and the reactor bracket in accordance with the embodiment of the present disclosure.
Figure 9:
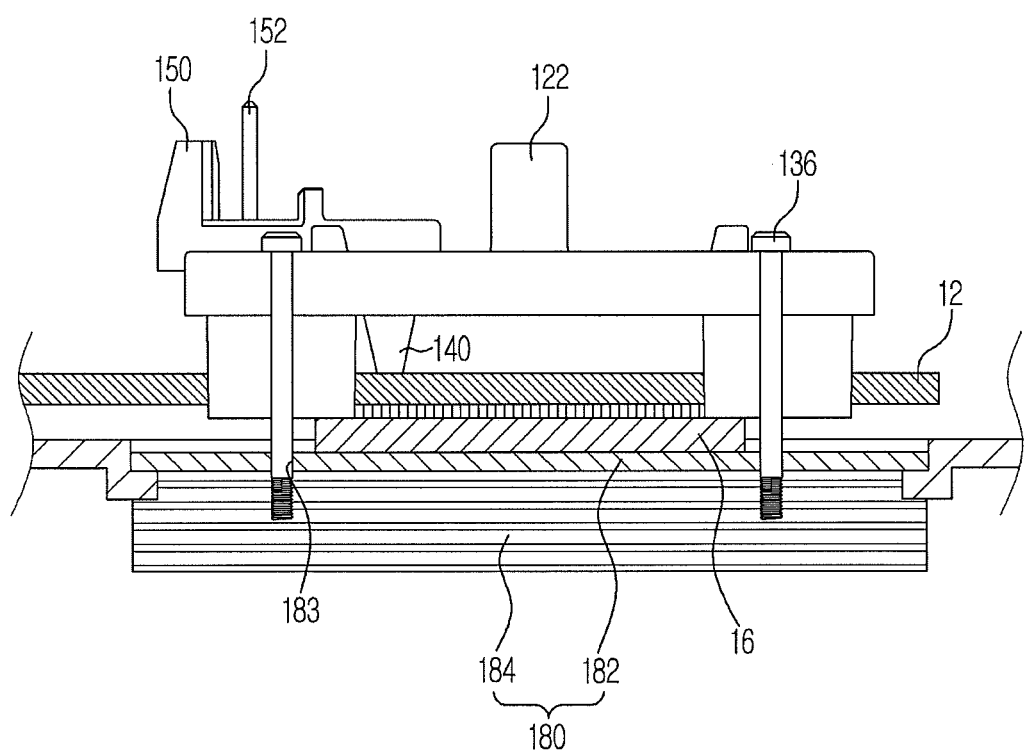
FIG. 9 is a cross-sectional view illustrating mounting of the reactor bracket in accordance with the embodiment of the present disclosure.

FIG. 7 is a perspective view illustrating a reactor and a reactor bracket in accordance with one embodiment of the present disclosure, FIG. 8 is a front view illustrating the reactor and the reactor bracket in accordance with the embodiment of the present disclosure, and FIG. 9 is a cross-sectional view illustrating mounting of the reactor bracket in accordance with the embodiment of the present disclosure.

Another heating device 15b may be provided on the circuit board 12.

The heating device 15b may be provided on the rear surface of the circuit board 12. A heat radiation member 180 for the purpose of heat radiation may be provided at one side of the heating device 15b.

The heat radiation member 180 may be supported by the circuit board 12 or be supported using a separate support member. In this embodiment, one end of the heat radiation member 180 is received in a heat radiation member holder part 22 provided on one surface of the case 20.

In more detail, the case 20 includes a heat radiation hole 23, through which the heat radiation member 180 passes, formed on one surface of the case 20, and the heat radiation member 180 may be provided to discharge heat absorbed from the heating unit 14 to the outside through heat exchange with external air.

The heat radiation member receipt part 22 is provided on the case 20 at the periphery of the heat radiation hole 23. The heat radiation member receipt part 22 may be provided in a stepped structure from the inside to the outside of the case 20 so that the heat radiation member 180 may be received on the heat radiation member receipt part 22.

The heat radiation member 180 may be formed of a metal material having high thermal conductivity, such as aluminum. The heat radiation member 180 may include a heat radiation plate 182 and a plurality of heat radiation fins 184 supported by one surface of the heat radiation plate 182.

The heat radiation plate 182 may contact the heating device 15b and, more particularly, the rear surface of the heat radiation plate 182 may contact the upper surface of the heating device 15b provided on the rear surface of the circuit board 12. The heat radiation fins 184 are provided on one surface of the heat radiation plate 182 so as to discharge heat of the heating device 15b absorbed by the heat radiation plate 182.

Although the shape of the heat radiation fins 184 is not limited, the plural heat radiation fins 184 in this embodiment may be provided vertically to the heat radiation plate 182.

In order to prevent sudden change of current, a reactor 100 may be provided. The reactor 100 may be formed in a wire wound shape.

The reactor 100 may be formed in a closed loop structure in which a wire is wound in a loop shape so as to prevent leakage of a magnetic field. Thereby, malfunction of peripheral devices or other components or damage thereto may be removed and an installation space may be greatly reduced.

A reactor bracket 110 serves to support and fix the reactor 100. The reactor bracket 110 may include a base 120, fastening members 130, a separation protrusion 140, and a terminal connection member 150.

The reactor 100 is received on the base 120. In this embodiment of the present disclosure, the reactor 100 is provided in a ring shape of a closed loop structure having a hollow and thus, the base 120 may be provided in a circular shape.

A receipt protrusion 122 protruding from the base 120 and corresponding to the hollow of the reactor 100 is provided at the center of the base 120 and the reactor 100 may be fixed to the base 120 by the receipt protrusion 122 without secession of the reactor from the base 120. The receipt protrusion 122 may have any configuration being capable of fixing the reactor 100 and, in this embodiment, is provided in a cylindrical shape.

The base 120 may include a receipt flange 124, at least one of which is bent upward in the circumferential direction, at the outer circumferential portion thereof. The receipt flange 124 may guide the outer circumferential portion of the reactor 100 received on the base 120.

The fastening members 130 are disposed at the ends of the base 120 and serve to combine the base 120 and the heat radiation member 180 with each other.

The fastening member 130 may include a fastener 132 provided with a fastening hole 132a through which a fastening bolt 136 combined with the heat radiation member 180 passes. In more detail, the fastening bolt 136 passes through the fastening hole 132a and a through hole 12a of the circuit board 12 and is then combined with a combination hole 183 of the heat radiation member 180 provided on the rear surface of the circuit board 12.

A support surface 134 may be provided at the end of the fastener 132 so that at least a portion of the support surface 134 may support the other surface of the heating device 15b, i.e., the surface of the heating device 15b opposite to the circuit board 12. In more detail, the fastener 132 may pass through the circuit board 12 and be provided so that the fastener 132 at one side of the circuit board 12 may support the base 120 and the fastener 132 at the other side of the circuit board 12 may support the surface of the heating device 15b opposite to the circuit board 12.

The support surface 134 supports the other surface of the heating device 15b, i.e., the surface of the heating device 15b opposite to the circuit board 12, and combines the fastener 132 with the heat radiation member 180 using the fastening bolt 136, thus being capable of closely adhering the heating device 15b and the heat radiation member 180 to each other.

In order to firmly support the reactor 100, at least one fastening member 130 may be provided. In this embodiment of the present disclosure, a pair of fastening members 130 are provided at both ends of the base 120.

The separation protrusion 140 is provided to separate the base 120 and the circuit board 12 from each other.

In order to assure an insulating distance between the reactor 100 and the circuit board 12, the separation protrusion 140 is provided so that the base 120 and the circuit board 12 may be separated from each other by a first distance L. The separation protrusion 140 is not limited in shape and may have any configuration to separate the base 120 and the circuit board 12 from each other. In this embodiment of the present disclosure, the separation protrusion 140 may be formed in a truncated conical shape and protrude from the lower surface of the base 120, i.e., the surface of the base 120 opposite to the circuit board 12.

The separation protrusion 140 may be provided more closely to the outer circumferential portion of the base 120 than the center of the base 120. In more detail, the separation protrusion 140 may be provided close to the terminal connection member 150. In order to prevent a terminal connection pin 152, which will be described below, from contacting the circuit board 12 although the reactor bracket 110 loses balance and stumbles on the circuit board 12, the separation protrusion 140 may serve to support the reactor bracket 110.

The terminal connection member 150 is provided at one side of the outer circumferential portion of the base 120 and separated from the fastening members 130 in the circumferential direction. A terminal wire 101 of the reactor 100 is connected to the terminal connection member 150 and thus, the terminal connection member 150 serves to connect the reactor 100 to an external power source and thus to transmit power to the reactor 100.

The terminal connection pin 152 formed of a conductive material may pass through the terminal connection member 150. The terminal wire 101 may be combined with one end of the terminal connection pin 152 and the external power source is connected to the other end of the terminal connection pin 152 and thus, power may be supplied to the terminal wire 101.

In more detail, the terminal connection pin 152 may vertically penetrate the terminal connection member 150 and the terminal wire 101 of the reactor 100 may be connected to the lower end of the terminal connection pin 152 having penetrated the terminal connection member 150. Further, the external power source may be connected to the upper end of the terminal connection pin 152 having penetrated the terminal connection member 150.

A terminal wire guide 125 may be provided on the base 120 so as to easily connect the terminal wire 101 to the terminal connection pin 152. The terminal wire guide 125 is formed to a height lower than the height of the receipt flange 124 and thus guides the terminal wire 101.

Hereinafter, a reactor mounting process of the controller 1 having the above-described configuration will be described.

The heating device 15b mounted on one surface of the circuit board 12 is provided so that one side of the heating device 15b contacts the heat radiation member 180 for the purpose of heat radiation.

The reactor 100 is provided on the other surface of the circuit board 12 on which the heating device 15b is mounted. Here, the reactor 100 is received in the reactor bracket 110.

The reactor 100 is received on the base 120 of the reactor bracket 110 and the fastening members 130 of the reactor bracket 110 are combined with the heat radiation member 180.

In more detail, one surface of each of the fastening members 130 supports the surface of the heating device 15b at the side of the circuit board 12 and the fastening bolts 136 pass through the fastening holes 132a of the fasteners 132 and the through holes 12a of the circuit board 12 and are combined with the combination holes 183 of the heat radiation member 180, thus being capable of closely adhering and fixing the reactor bracket 110, the heating device 15b, and the heating member 180 to each other.

As is apparent from the above description, a controller in accordance with one embodiment of the present disclosure may have an improved heat radiation structure and thus increase heat radiation efficiency, and lower temperature in a normal state during driving of the controller and thus extend the lifespan of electrical devices and electronic devices.

Further, the controller may be hermetically sealed and thus, the inside of the controller may be safely protected from dust or moisture.

Although a few embodiments of the present disclosure have been shown and described, it would be appreciated by those skilled in the art that changes may be made in these embodiments without departing from the principles and spirit of the invention, the scope of which is defined in the claims and their equivalents.

What is claimed is:

1. A controller comprising:
    a case provided with at least one opened surface;
    a cover opening and closing the at least one opened surface; and
    a circuit board provided within the case and provided with a heating unit,
    wherein the cover includes
        a cover body; and
        a heat radiation unit formed at a portion of the cover body, the heat radiation unit being formed concavely inward with respect to the cover body toward the circuit board, so as to be closely adhered to the heating unit for the purpose of heat radiation,
        wherein the thickness of the cover body is smaller than the thickness of the heat radiation unit.

2. The controller according to claim 1, wherein the rear surface of the heat radiation unit is concave, as compared to the outer surface of the cover body adjacent thereto.

3. The controller according to claim 2, wherein the convex degree of the inner surface of the cover body inwardly toward the circuit board and the concave degree of the rear surface of the heat radiation unit are the same.

4. The controller according to claim 1, wherein the heating unit includes:
    a heating device disposed on the circuit board; and
    a device cover surrounding the heating device, inner and outer surfaces of the device cover contacting the heating device and the heat radiation unit.

5. The controller according to claim 4, wherein the heating device is an intelligent power module (IPM).

6. The controller according to claim 1, wherein the cover is formed of aluminum.

7. A controller comprising:
    a case provided with at least one opened surface;
    a cover opening and closing the at least one opened surface; and
    a circuit board provided within the case and provided with a heating unit,
    wherein the cover includes a cover body and a heat radiation unit formed at a portion of the cover body, the heat radiation unit being formed concavely inward with respect to the cover body toward the circuit board, so as to be closely adhered to the heating unit for the purpose of heat radiation, and
    wherein the heat radiation unit includes
        a heat radiation plate closely adhered to an upper surface of the heating unit; and
        a support part bent from an outer circumferential portion of the heat radiation plate and connected to the cover body,
        wherein the thickness of the cover body is smaller than the thickness of the heat radiation plate.

8. The controller according to claim 7, wherein the thickness of the heat radiation plate and the thickness of the support part are the same.

9. The controller according to claim 7, wherein the heat radiation plate is provided so as to be closely adhered to the whole upper surface of the heating unit.

10. The controller according to claim 7, further comprising a heat radiation sheet provided on one surface of the heat radiation plate contacting the heating unit to increase a heat radiation area.

11. The controller according to claim 7, wherein the upper ends of the heat radiation plate and the heating unit are formed in a rectangular shape.

12. The controller according to claim 7, wherein the heat radiation unit further includes at least one heat radiation fin traversing a heat radiation space, formed by the heat radiation plate, the support part and the outer surface of the cover body, and supported by the support part and the heat radiation plate.

13. A controller comprising:
a case provided with an opened surface;
a circuit board provided within the case and provided with a heating unit; and
a cover including a cover body and a heat radiation unit protruding and extending inwardly from the cover body toward the circuit board, and opening and closing the opened surface,
wherein the heat radiation unit includes
a heat radiation plate closely adhered to an upper surface of the heating unit; and
a support part bent from an outer circumferential portion of the heat radiation plate, extending from the heat radiation plate, and connected to the cover body,
wherein the thickness of the cover body is smaller than the thickness of the heat radiation plate.

14. The controller according to claim 13, further comprising a heat radiation space provided with a lower surface surrounded by the heat radiation plate, an upper surface surrounded by the outer surface of the cover body, and a side surface surrounded by the support part,
wherein an area of a region of the heat radiation space at the side of the outer surface of the cover body is greater than the area of a region of the heat radiation space at the side of the heat radiation plate.

15. The controller according to claim 13, further comprising a heat radiation sheet provided on one surface of the heat radiation plate contacting the heating unit to increase a heat radiation area.

16. A controller comprising:
a case provided with at least one opened surface;
a cover opening and closing the at least one opened surface; and
a circuit board provided within the case and provided with a heating unit,
wherein the cover includes a cover body and a heat radiation unit formed at a portion of the cover body, the heat radiation unit being formed concavely inward with respect to the cover body toward the circuit board, so as to be closely adhered to the heating unit for the purpose of heat radiation, and
wherein the heat radiation unit includes
a heat radiation plate closely adhered to an upper surface of the heating unit; and
a support part bent from an outer circumferential portion of the heat radiation plate and connected to the cover body,
wherein the support part provided at the side of the heat radiation plate has a first lengthwise width and a first breadthwise width and the other end of the support part provided at the side of the cover body has a second lengthwise width and a second breadthwise width, the first lengthwise width and the first breadthwise width being smaller than the second lengthwise width and the second breadthwise width.

17. A controller comprising:
a case provided with at least one opened surface;
a cover opening and closing the at least one opened surface; and
a circuit board provided within the case and provided with a heating unit,
wherein the cover includes a cover body and a heat radiation unit formed at a portion of the cover body, the heat radiation unit being formed concavely inward with respect to the cover body toward the circuit board, so as to be closely adhered to the heating unit for the purpose of heat radiation, and
wherein the heat radiation unit includes
a heat radiation plate closely adhered to an upper surface of the heating unit;
a support part bent from an outer circumferential portion of the heat radiation plate and connected to the cover body; and
at least one heat radiation fin traversing a heat radiation space, formed by the heat radiation plate, the support part and the outer surface of the cover body, and supported by the support part and the heat radiation plate,
wherein the thickness of a portion of the at least one heat radiation fin at the side of the outer surface of the cover body is smaller than the thickness of a portion of the at least one heat radiation fin at the side of the heat radiation plate.

* * * * *